United States Patent [19]
Liu et al.

[11] Patent Number: 5,624,859
[45] Date of Patent: Apr. 29, 1997

[54] METHOD FOR PROVIDING DEVICE ISOLATION AND OFF-STATE LEAKAGE CURRENT FOR A SEMICONDUCTOR DEVICE

[75] Inventors: David K. Y. Liu, Cupertino; Mark T. Ramsbey, Sunnyvale, both of Calif.

[73] Assignee: Advanced Micro Devices, Inc., Sunnyvale, Calif.

[21] Appl. No.: 476,388

[22] Filed: Jun. 7, 1995

[51] Int. Cl.⁶ ................................................. H01L 21/265
[52] U.S. Cl. ........................... 438/298; 438/525; 438/450
[58] Field of Search .................. 437/35, 29, 27, 437/61, 63, 60, 26, 41, 44

[56] References Cited

U.S. PATENT DOCUMENTS

| | | | |
|---|---|---|---|
| Re. 35,036 | 9/1995 | Yabu et al. | 437/35 |
| 4,506,436 | 3/1985 | Bakeman, Jr. et al. | 437/26 |
| 5,019,520 | 5/1991 | Komori et al. | 437/26 |
| 5,286,666 | 2/1994 | Katto et al. | 437/26 |
| 5,344,787 | 9/1994 | Nagalingam et al. | 437/35 |
| 5,372,957 | 12/1994 | Liang et al. | 437/35 |
| 5,376,566 | 12/1994 | Gonzalez | 437/35 |
| 5,411,899 | 5/1995 | Lee et al. | 437/35 |
| 5,432,106 | 7/1995 | Hong | 437/35 |
| 5,432,107 | 7/1995 | Uno et al. | 437/35 |
| 5,439,835 | 8/1995 | Gonzalez | 437/35 |
| 5,459,085 | 10/1995 | Pasen et al. | 437/35 |

*Primary Examiner*—Tom Thomas
*Assistant Examiner*—Lynne A. Gurley
*Attorney, Agent, or Firm*—Benman Collins & Sawyer

[57] ABSTRACT

A method and system for providing a semiconductor device with device isolation and leakage current control which entails processing a semiconductor substrate to form a semiconductor circuit, and providing at least one high energy implant on the semiconductor circuit is disclosed. The high energy implant is provided at an angle to source and drain regions of the semiconductor circuit so as to allow a dosage from the at least one high energy implant below and away from the surface of the active device region. In so doing, a profile is provided in which dopant distribution is substantially uniform. Therefore, the breakdown characteristics are increased and the junction capacitance of the device is reduced. Accordingly, a device manufactured in accordance with the present invention has significant advantages over devices manufactured in accordance with conventional processes.

9 Claims, 6 Drawing Sheets

200

200

200

200

METHOD FOR PROVIDING DEVICE ISOLATION AND OFF-STATE LEAKAGE CURRENT FOR A SEMICONDUCTOR DEVICE

FIELD OF THE INVENTION

The present invention relates generally to the processing of a semiconductor device and more particularly to a system for providing device isolation and off-state leakage current control for a semiconductor device.

BACKGROUND OF THE INVENTION

In CMOS technology, typically the device isolation is accomplished with a locos process. For such a process, it requires a high field threshold voltage and an additional field implant is provided. The field implant is typically accomplished with n-type dopant for p-channel devices and a p-type dopant for n-channel devices. Usually this implant step is provided with a conventional energy and dose. The implant is also typically performed early in the process flow to ensure that the dopant is adequately placed therewithin.

Additionally, this dopant could also be utilized to minimize the transistors off-state leakage current which is present in the active device region. Since this implant is placed uniformly in the device area, it has been found however that for many cells or many semiconductor circuits, using this conventional process the junction breakdown characteristics are lowered and junction capacitance is significantly increased as a result. As devices become smaller and the impact of processing temperature cycles becomes more significant, these problems become more acute. Hence, it is desired that integrated circuits be provided that have improved device isolation as well as improved leakage current control without impacting junction breakdown characteristics and junction capacitance. Such circuits should be easy to manufacture and are compatible with existing processing requirements. The present invention addresses such a need.

SUMMARY OF THE INVENTION

A method and system for providing a semiconductor device with device isolation and off-state leakage current control in accordance with the present invention is disclosed. The method and system comprises processing a semiconductor substrate to form a semiconductor circuit, and providing at least one high energy implant on the semiconductor circuit. At least one high energy implant is provided at an angle to the source and drain regions of the semiconductor circuit so as to allow a dosage from at least one high energy implant to be below the gate and the field oxide region. In so doing, a profile is provided in which the dopant distribution is substantially offset from the highly doped junction region. Therefore, the junction breakdown voltage capabilities are increased and the junction capacitance of the device is reduced. Accordingly, a device manufactured in accordance with the present invention has significant advantages over devices manufactured in accordance with conventional processes.

DETAILED DESCRIPTION OF THE INVENTION

The present invention is directed toward an improvement in the processing of a semiconductor device. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
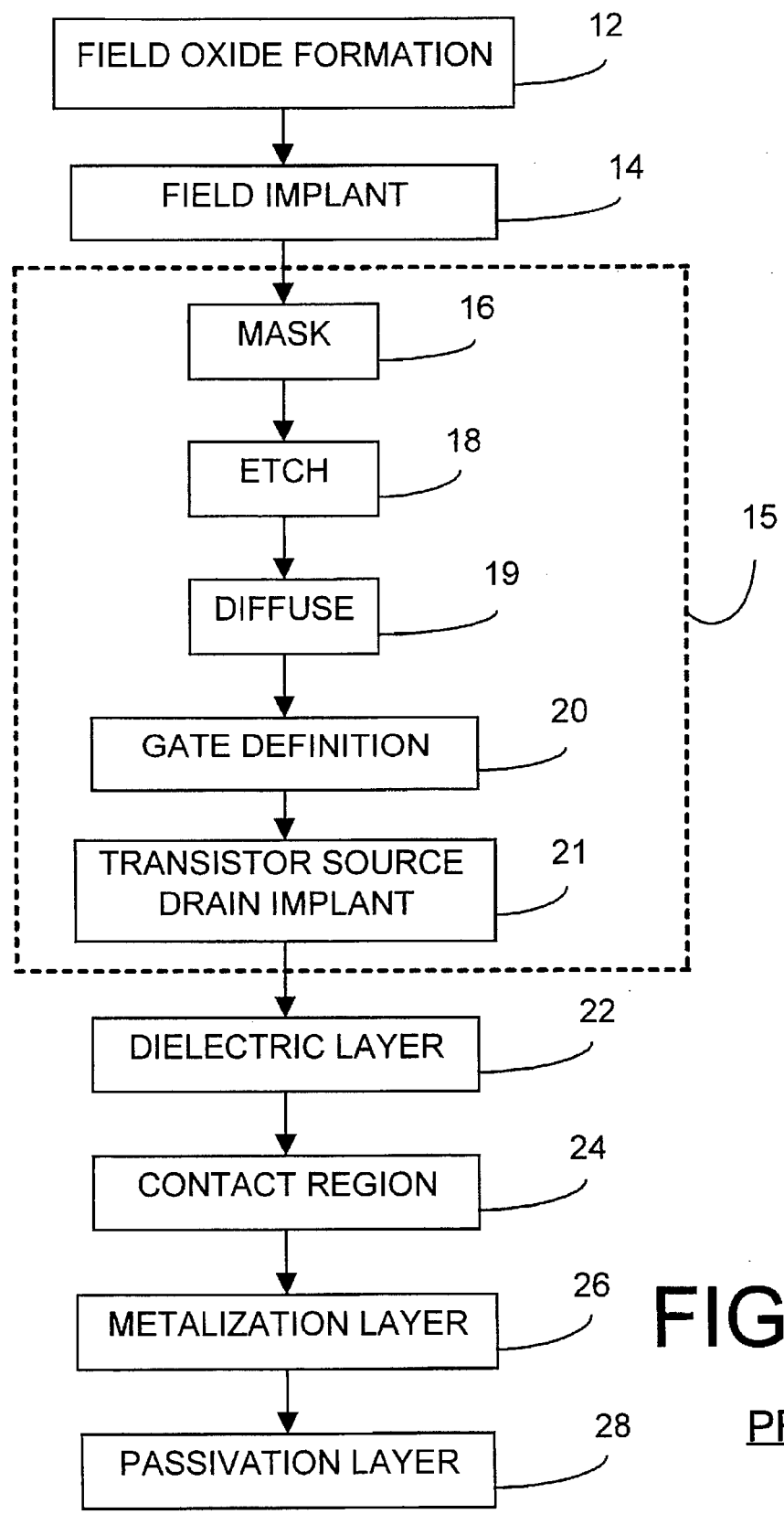
FIG. 1 is a flow chart showing a conventional manufacturing process for a conventional.

Referring now to FIG. 1, what is shown is a flow chart of a conventional process flow for a semiconductor device. As is seen, a field oxide is selectively grown on the semiconductor substrate, via step 12. Thereafter a field implant is provided at a conventional dose to dope the region, via step 14. The field implant acts to increase the threshold voltage of the parasitic field transistor shown in FIG. 1A, and also to reduce the off-state leakage current of the transistor. Thereafter, the integrated circuit are provided through various manufacturing steps, step 15. As is seen typically, these steps are masking the substrate via step 16, etching the substrate to provide the circuit element, via step 18, providing a diffusion layer, via step 19, providing transistor gate definition, via step 20 and performing the transistor source/drain implant, via step 21. Thereafter, a dielectric region is formed via step 22. Next, a contact region and a metallization layer is provided via steps 24 and 26, respectively. Finally, a passivation layer is provided via step 28.

Figure 1A:
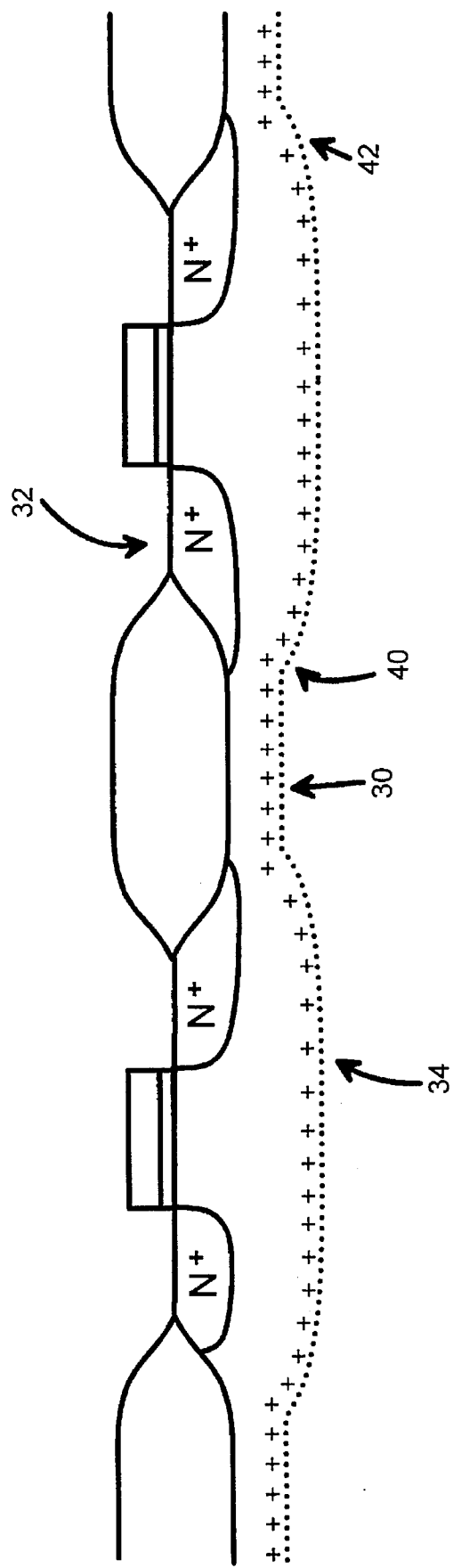
FIG. 1A is a diagram showing the dopant distribution of a semiconductor device manufactured in accordance with the process of FIG. 1.

Referring to FIG. 1A, a field implant dose 30 is provided in a conventional manner through the silicon substrate 32 to provide the dopant layer 34 therewithin. The dosage requirements of the field implant is typically $10^{12}/cm^2$–$10^{13}/cm^2$. The energy levels for the implant is typically 50 KeV–150 KeV.

It is well known that in semiconductor processing the manufacturing steps 16–21 require high temperatures for relatively long periods of time. For example, the subsequent gate oxidation and dopant diffusion processes would require temperature up to 1000° C. for nearly 10's of minutes. Hence, the dopant provided is subject to a high thermal exposure which can cause significant dopant re-distribution. This dopant redistribution results in not only higher body effect, but also lowers junction breakdown voltage 42 and higher junction capacitance 40. Accordingly at higher dosages of doping the depletion region of the device becomes narrow. This in turn provides for poor device performance and the like. As is seen in the Figure, as the manufacturing step 15 takes place, there is a redistribution of the dopant.

Applicants have discovered that by performing at least one implant at a high dosage after the thermal process that is at an angle to the source and drain regions of the semiconductor device that such dopant redistribution is reduced. Thus, leakage control and device isolation is provided without the dopant redistribution problems associated with the conventional process.

Figure 2:
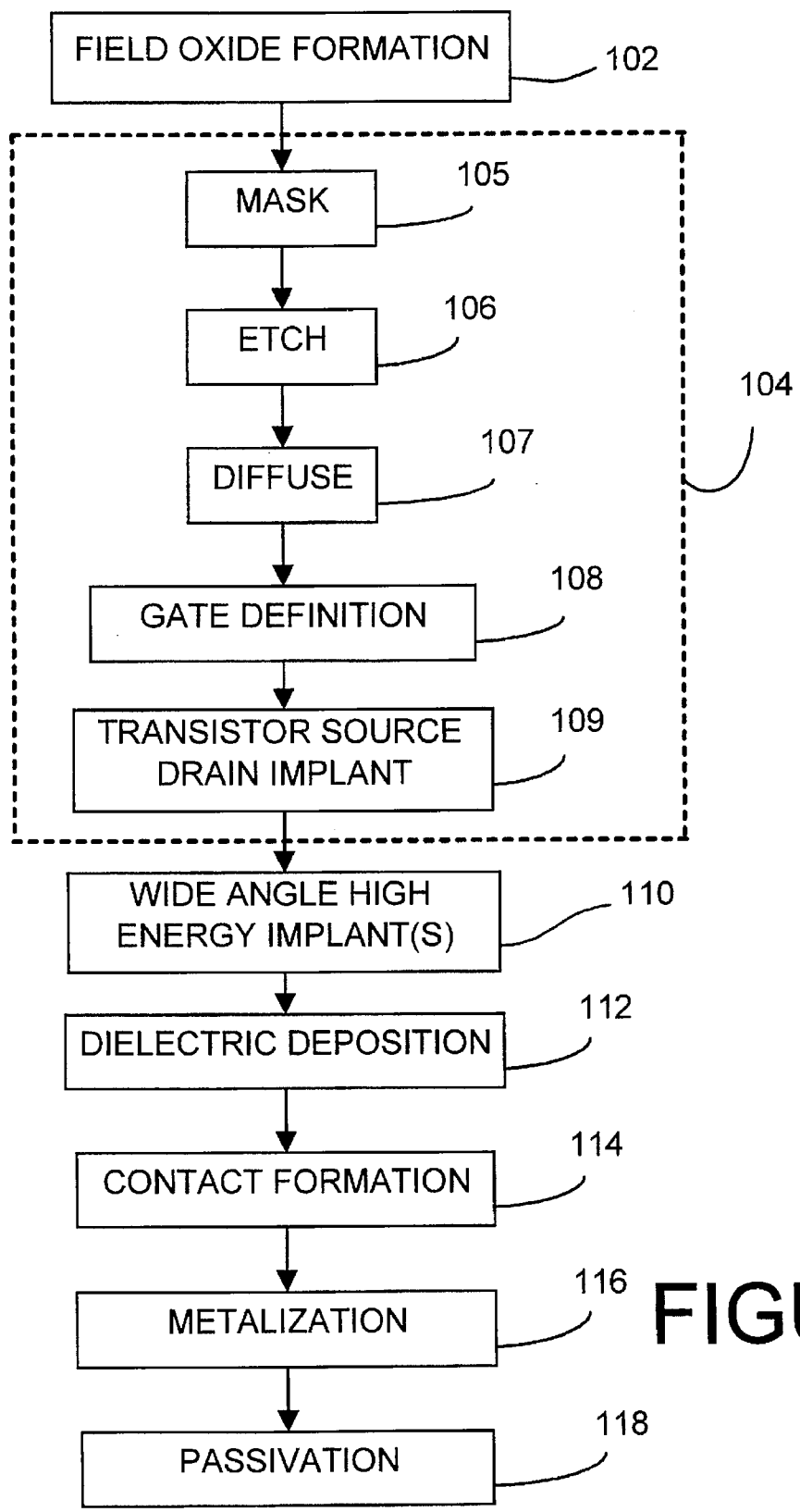
FIG. 2 is a flow chart showing the manufacturing process for a semiconductor device in accordance with the present invention.

To more specifically describe the present invention, refer now to FIG. 2, which is a flow chart of the operation of the system in accordance with the present invention. In such a system as is shown, the field oxide is provided as was done before via step 102, however, instead of providing a conventional field implant as provided in the conventional process of FIG. 1, the circuit is manufactured via the steps in 104. The steps in 104 typically mirror the manufacturing steps of a conventional process. After the semiconductor circuit processing steps 105–109 at least one high energy/ large angle implant is provided via step 110. The high energy/larger angle implant is provided at an angle to the drain and source at regions of the device at such a dose such that the dopant can be placed below the gate and the field oxide as well as away from the source and drain junction regions of the semiconductor device. A typical energy level to provide the appropriate dopant profile is between 150 KeV and 500 KeV, and an angle of 30°–45°.

The remaining steps of dielectric deposition, metallization and passivation are then provided via steps 112 through 118. By providing the large angle tilt implant at a high energy near the end of processing step, dopant distribution is more easily controlled because the dopant is not affected by the portions of the manufacturing process 104 that are at high temperatures. Accordingly, control of field isolation and transistor offstate leakage can be provided without suffering the penalties of a high junction capacitance and a low junction breakdown voltage.

Figure 2A:
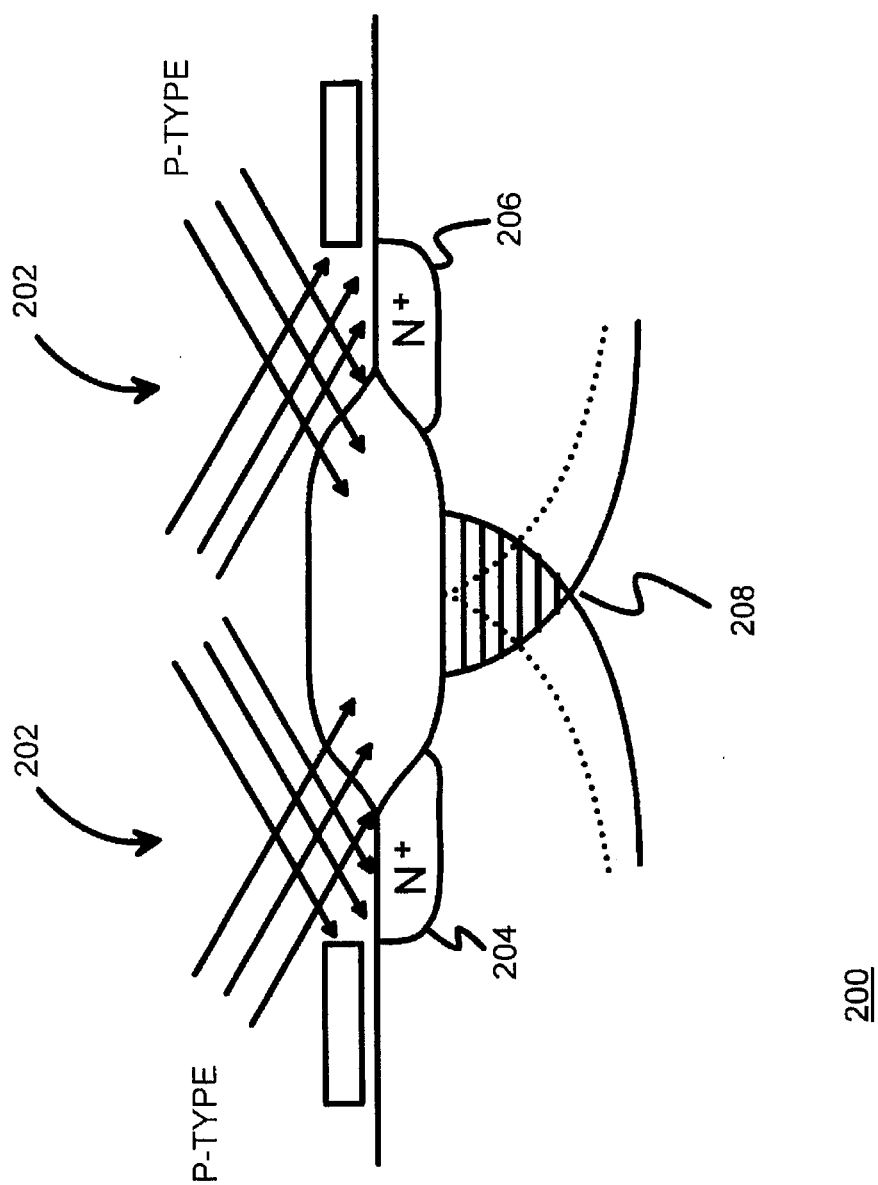
FIG. 2A shows a high energy/large angle implant of a semiconductor device in accordance with the present invention.
Figure 3A:
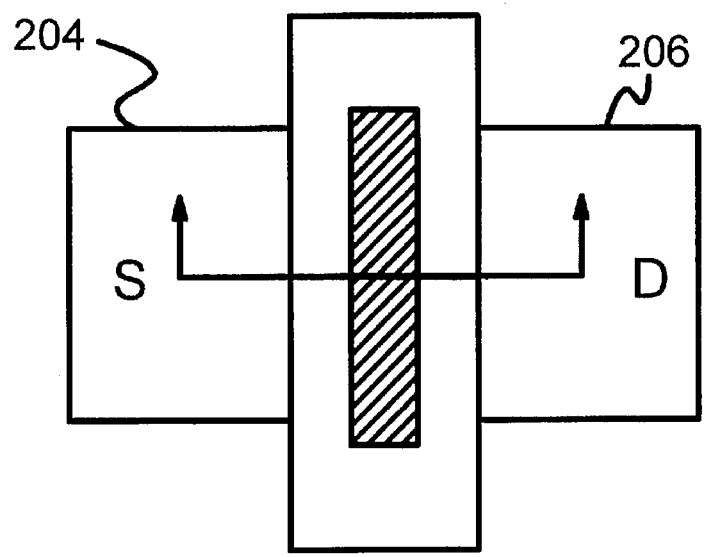
FIGS. 3A–3D shows the high energy/large angle implant be provided to a semiconductor device at rotations of 90 degrees, 180 degrees, 270 degrees and 360 degrees, respectively, relative to the source/drain regions of the semiconductor device.
Figure 3B:
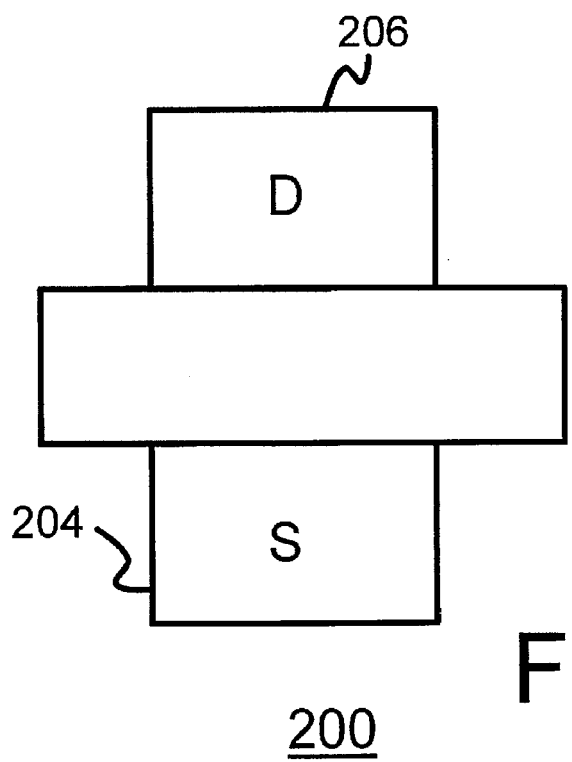
Figure 3C:
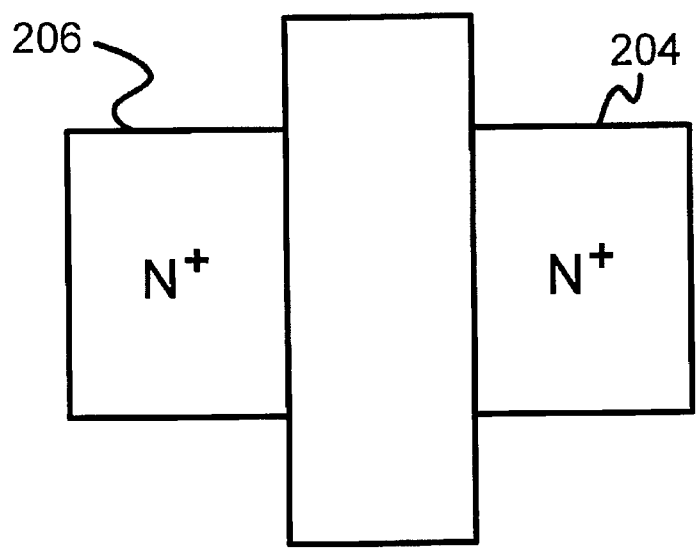
Figure 3D:
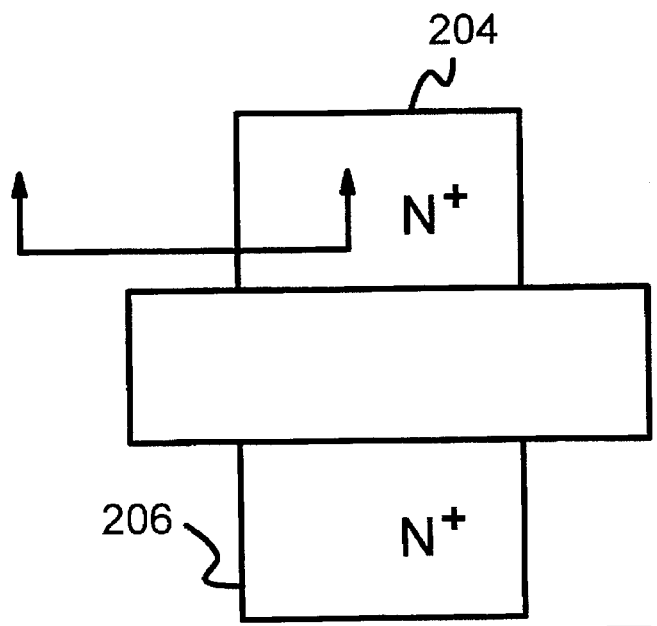

Referring now to FIG. 2A, what is shown is a plurality of high energy/large angle implants 202 that is provided relative to the source/drain regions 204 and 206 of the device 200.

In a preferred embodiment the implant is provided to the device at a large tilt angle of 30°–45° with 4 rotations of 90 degrees, 180 degrees, 270 degrees and 360 degrees with respect to the source/drain region at dose rate of 150 KeV. The purpose of rotation is to ensure that dopant is uniformly distributed and no shadowing problem associated with the implant. Referring to FIGS. 3A through 3D, what is shown is the implant being provided to a transistor device at rotations of 90 degrees, 180 degrees and 270 degrees, relative the source and drain region of the device respectively. As is seen by utilizing this arrangement of FIG. 2, this would provide a narrow dopant distribution on the semiconductor device 200 shown at 208 in FIG. 2A.

The placement of the dose below the surface is optimal since it does not impact body effect of the active transistor, and yet it effectively reduces any off-state leakage current that typically occurs below the surface, without introducing higher junction capacitance or lower junction breakdown voltage.

Typically, the minimum transistor in the technology is used to determine the implant dose and energy. Thereafter, the implant energy is set so that the range of implant (or peak of implant profile) will be at the center of the minimum channel device to allow for the proper dopant. It has been found that longer channel devices will benefit from the implant, and that the shortest channel devices benefit the most from a system in accordance with the present invention.

It should be understood that although the rotation of the implant to the source/drain regions have been described at 90 degrees, 180 degrees, 270 degrees and 360 degrees, and the angle of the implant is at 30°–45°, one of ordinary skill in the art readily recognizes that the implant can be provided at a variety of angles and rotations and those angles and rotations would be within the spirit and scope of the present invention. The key element is that the dosage should be at such an angle and should be such a value that the source and drain regions are unaffected and the area underneath the gate region is properly doped.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skills in the art without departing from the spirit and scope of present invention, the scope of which is defined solely by the appended claims.

We claim:

1. A method for providing a semiconductor device with device isolation and off-state leakage current control comprising the steps of:

a) processing a semiconductor substrate to form a semiconductor circuit having a gate and source and drain regions; and b) providing at least one high energy implant into the semiconductor circuit, the at least one high energy implant being at an angle between 30°–45° to the source and drain regions of the semiconductor circuit so as to form a buried doped region from the at least one high energy implant below the gate and field oxide region and spaced away from the source and drain regions.

2. The method of claim 1 in which the processing step (a) comprises the steps of:

a1) providing a field oxide layer on a semiconductor substrate;

a2) masking the semiconductor substrate;

a3) etching the masked semiconductor substrate;

a4) diffusing dopant into the etched and masked semiconductor substrate; and a5) forming a gate and source/drain diffused regions in the semiconductor circuit.

3. The method of claim 1 in which the at least one high energy implant level is between 150 KeV and 500 KeV.

4. The method of claim 1 in which step (b) comprises the step of providing four high energy implants at rotations of 90°, 180°, 270° and 360° degrees.

5. The method of claim 4 in which each of the four high energy implant levels is between 150 KeV and 500 KeV.

6. The method of claim 1 which further comprises the steps of:

c) providing a dielectric region on the semiconductor circuit;

d) providing a contact region on the semiconductor circuit; and e) providing a metallization region on the semiconductor circuit.

7. A method for providing a semiconductor device having a source and drain region with device isolation and off-state leakage current control comprising the steps of:

a) providing a field oxide layer on a semiconductor substrate;

b) masking the semiconductor substrate;

c) etching the masked semiconductor substrate;

d) diffusing dopant into the etched and masked semiconductor substrate;

e) forming a gate and a source/drain diffused region in the semiconductor circuit; and f) providing a plurality of high energy implants into the semiconductor circuit at a plurality of rotations of the semiconductor circuit, the high energy implants being at an angle between 30°–45° to the source and drain region of the semiconductor circuit so as to form a buried doped region from at least one of the plurality of high energy implants below the gate and field oxide layer and spaced away from the source and drain region.

8. The method of claim 7 in which the implant energy level of each of the plurality of high energy implants is between 150 KeV and 500 KeV.

9. The method of claim 8 in which high energy implant providing step (f) further comprises the step of providing four high energy implants at rotations of 90°, 180°, 270° and 360° degrees.

* * * * *